(12) United States Patent
Yang

(10) Patent No.: US 9,859,292 B2
(45) Date of Patent: Jan. 2, 2018

(54) 3D MEMORY PROCESS AND STRUCTURES

(71) Applicant: MACRONIX INTERNATIONAL CO., LTD., Hsinchu (TW)

(72) Inventor: Chin-Cheng Yang, Kaohsiung County (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 14/584,416

(22) Filed: Dec. 29, 2014

(65) Prior Publication Data

US 2016/0190151 A1 Jun. 30, 2016

(51) Int. Cl.

| | |
|---|---|
| *H01L 21/311* | (2006.01) |
| *H01L 27/088* | (2006.01) |
| *H01L 21/762* | (2006.01) |
| *H01L 21/8239* | (2006.01) |
| *H01L 21/768* | (2006.01) |
| *H01L 23/522* | (2006.01) |
| *H01L 27/115* | (2017.01) |
| *H01L 27/11565* | (2017.01) |
| *H01L 27/1157* | (2017.01) |
| *H01L 27/11573* | (2017.01) |

(Continued)

(52) U.S. Cl.
CPC .... *H01L 27/11565* (2013.01); *H01L 27/1157* (2013.01); *H01L 27/11573* (2013.01); *H01L 27/11575* (2013.01); *H01L 27/11578* (2013.01)

(58) Field of Classification Search
CPC ....... H01L 27/11578; H01L 2924/0002; H01L 27/11582; H01L 29/792; H01L 29/7926; H01L 27/11551; H01L 21/28273; H01L 27/11548
See application file for complete search history.

(56) References Cited

U.S. PATENT DOCUMENTS 8,643,076 B2 * 2/2014 Seo ............... H01L 27/11573
257/315
8,928,784 B2 1/2015 Watanabe et al.
(Continued)

FOREIGN PATENT DOCUMENTS

TW 201104852 2/2011

OTHER PUBLICATIONS

Official Action from Taiwanese Patent Application No. 104103971 dated May 18, 2016.

*Primary Examiner* — Allen Parker
*Assistant Examiner* — Ismail Muse
(74) *Attorney, Agent, or Firm* — Baker & McKenzie LLP

(57) ABSTRACT

Disclosed herein are semiconductor devices and methods for fabricating a semiconductor device. In an embodiment, a method of fabricating a semiconductor device comprises providing a substrate. The method further comprises forming, on the substrate, an array region having a first height, a peripheral region having a second height greater than the first height, and a border region, the border region separating the array region from the peripheral region. The method further comprises forming a plurality of alternating insulative and conductive layers over at least a portion of the array region and the border region. The method further comprises forming a trench through the plurality of alternating insulative and conductive layers in at least a portion of the border region, the trench having sloping sidewalls.

15 Claims, 15 Drawing Sheets

(51) Int. Cl.
*H01L 27/11575* (2017.01)
*H01L 27/11578* (2017.01)

(56) References Cited

U.S. PATENT DOCUMENTS

| | | | |
|---|---|---|---|
| 2010/0044756 A1* | 2/2010 | Hsia | H01L 27/101 257/209 |
| 2010/0311220 A1* | 12/2010 | Matsuo | H01L 21/02164 438/423 |
| 2011/0018051 A1* | 1/2011 | Kim | H01L 27/11575 257/324 |
| 2011/0199804 A1* | 8/2011 | Son | G11C 5/04 365/51 |
| 2011/0233653 A1* | 9/2011 | Lee | H01L 27/11573 257/324 |
| 2013/0017629 A1* | 1/2013 | Pyo | H01L 22/26 438/16 |
| 2013/0241019 A1 | 9/2013 | Mizuta et al. | |
| 2014/0061776 A1* | 3/2014 | Kwon | H01L 21/8239 257/329 |
| 2014/0151778 A1* | 6/2014 | Purayath | H01L 21/28273 257/316 |
| 2014/0226408 A1* | 8/2014 | Tokiwa | G11C 16/32 365/185.18 |
| 2015/0194595 A1* | 7/2015 | Park | H01L 43/12 257/421 |
| 2016/0056050 A1* | 2/2016 | Kong | H01L 21/31116 438/723 |
| 2016/0064281 A1* | 3/2016 | Izumi | H01L 21/76816 257/315 |
| 2016/0093626 A1* | 3/2016 | Izumi | H01L 21/76805 257/324 |

* cited by examiner

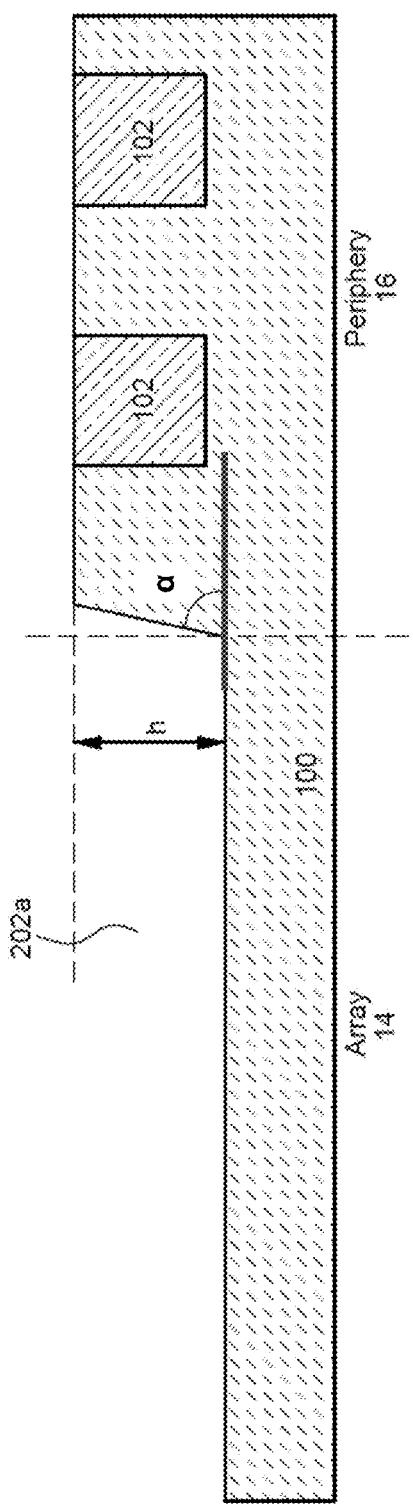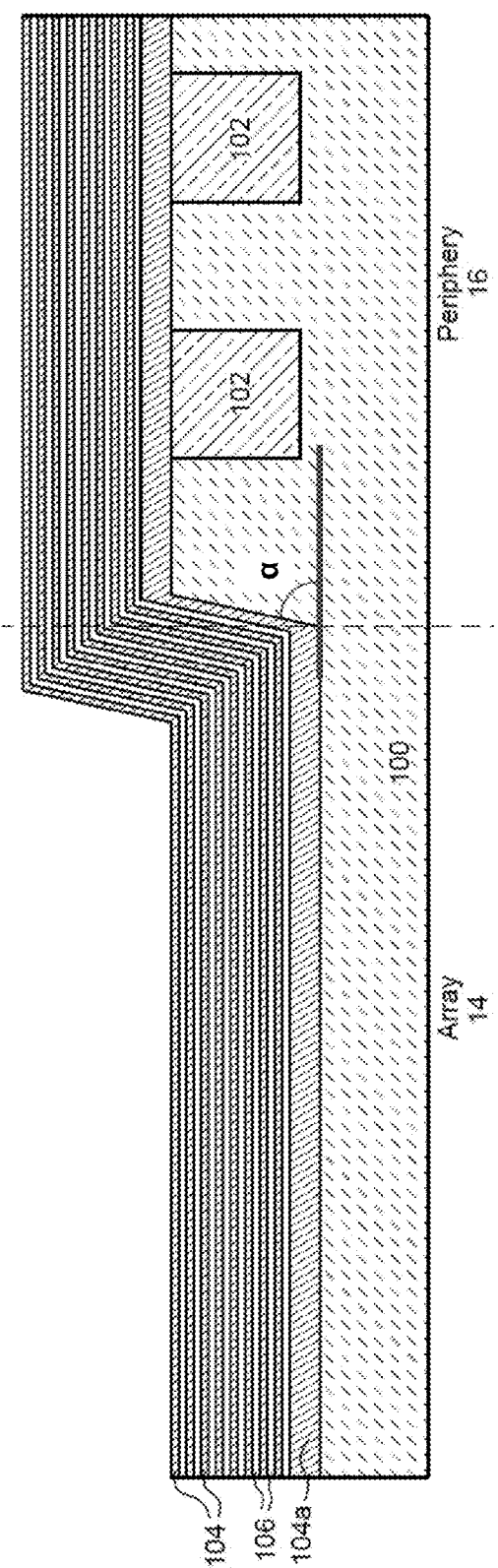

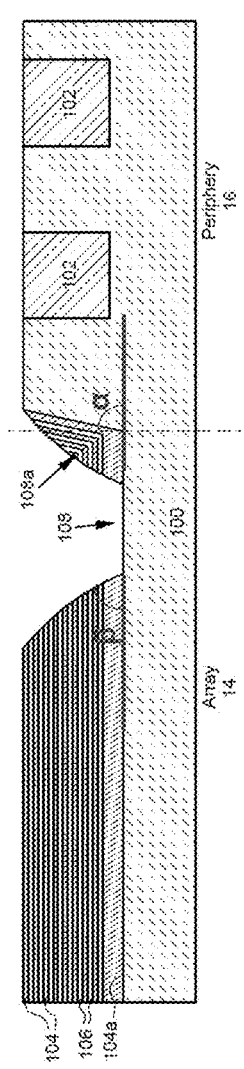 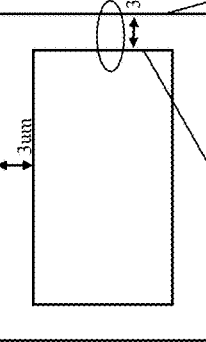 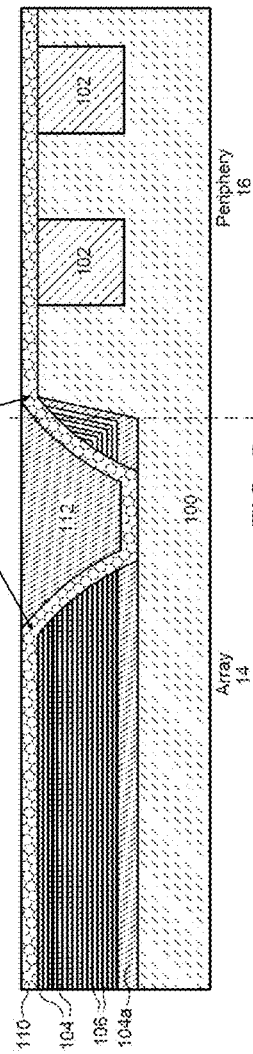
FIG. 4    FIG. 5

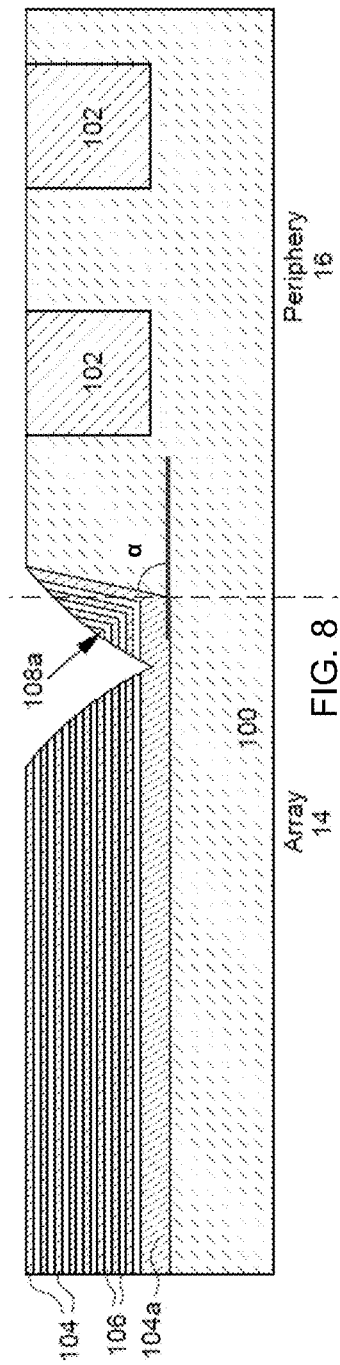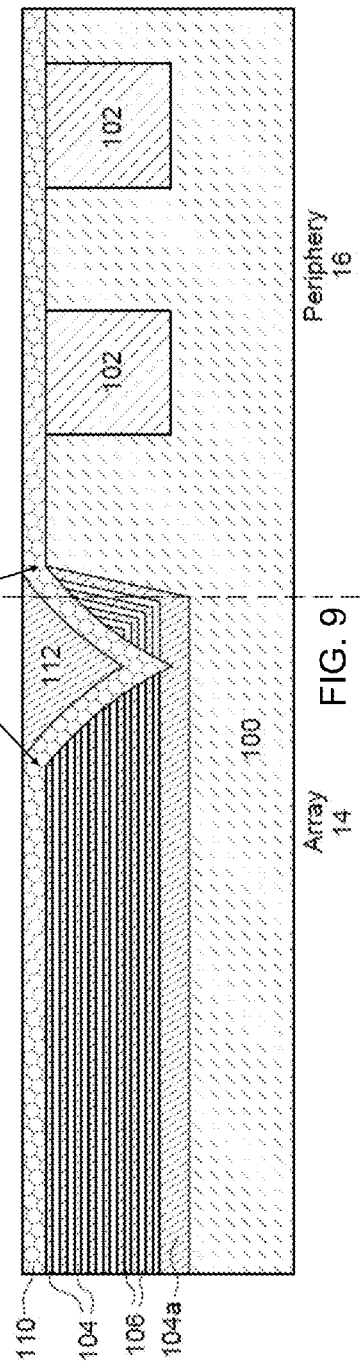

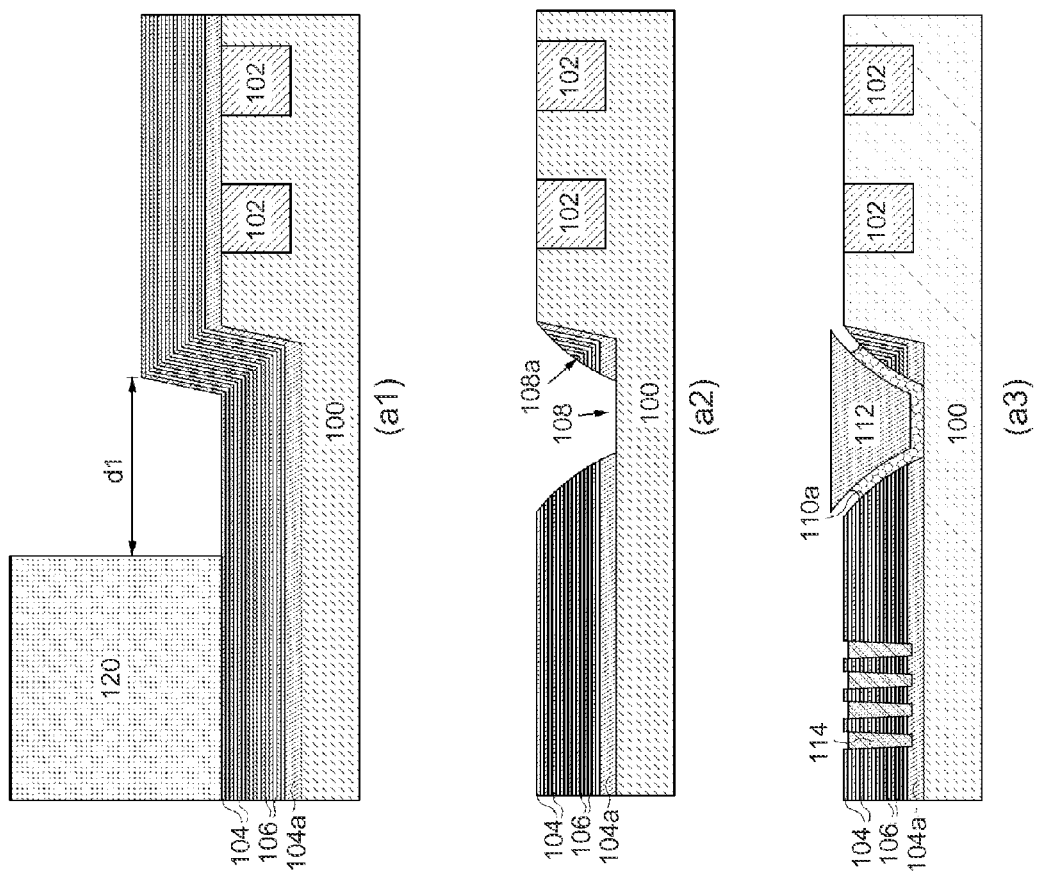

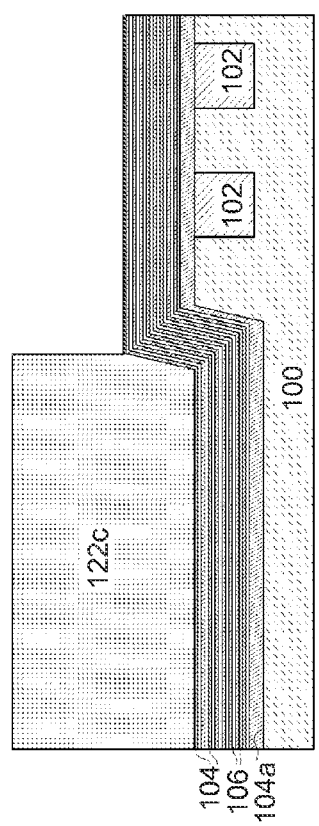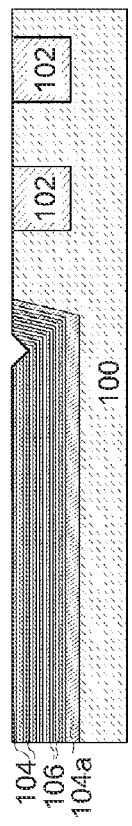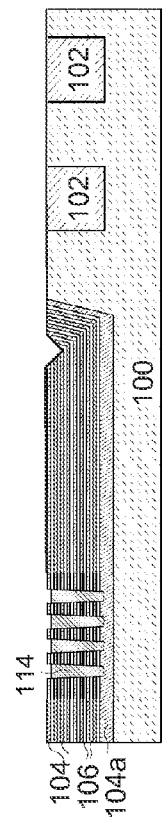
FIG. 13c

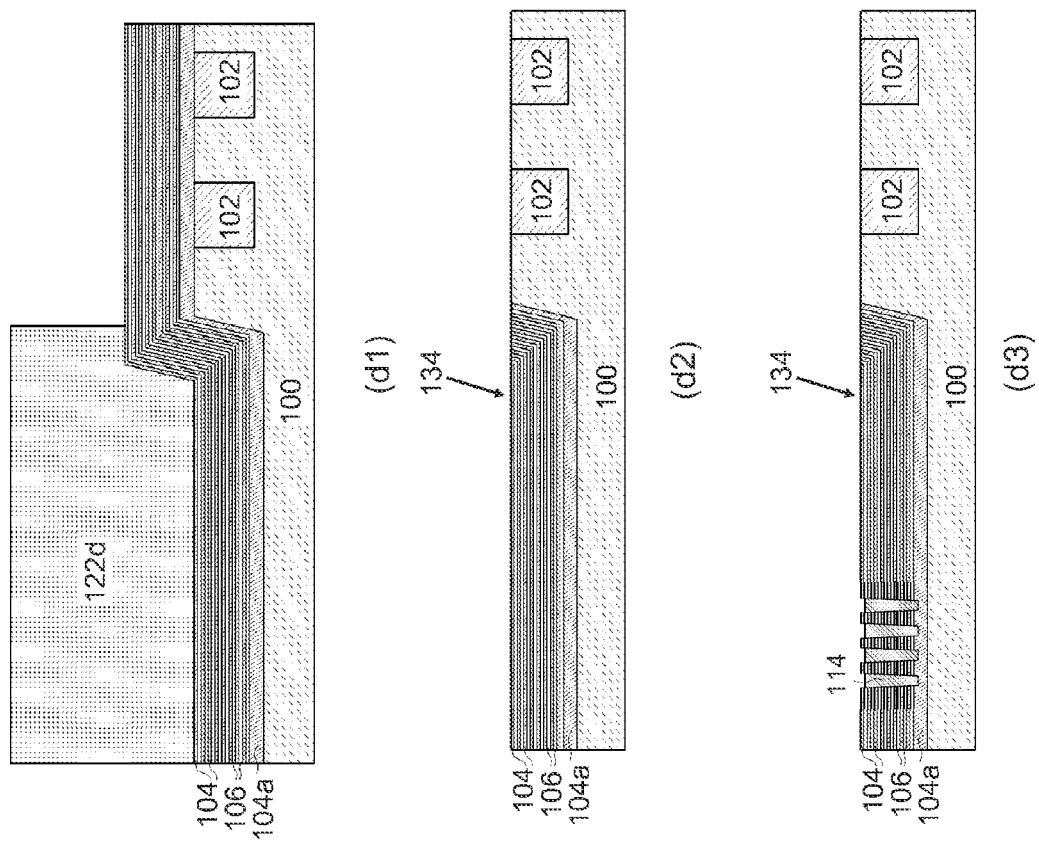

3D MEMORY PROCESS AND STRUCTURES

BACKGROUND

1. Technical Field

The present application relates generally to semiconductor devices and includes methods and structures for improving the fabrication of semiconductor devices such as 3D memory structures.

2. Related Art

NAND flash memory is a nonvolatile memory that is used in a wide range of applications including mobile phones, digital cameras, and solid-state hard drives. The high storage density of NAND flash memory, especially when compared to NOR flash memory, has played a large role in its market penetration. This storage density is achieved in part through the use of strings of memory cells connected in series between a ground line and bit lines, which reduces the number of metal contacts required. These strings are commonly called "NAND strings" due to their resemblance to NAND gates. Each memory cell within a NAND string can be addressed by a word line that the memory cell shares with neighboring cells of other NAND strings. In the past, NAND flash memory has been implemented as a two-dimensional (planar) array defined by word lines and bit lines that intersect perpendicularly, with the memory cells being formed at those intersections.

The NAND string topology has been further developed to achieve still greater storage density. Such efforts have lead to the development of three-dimensional (3D) NAND flash memory, in which memory cells are stacked vertically on top of one another.

Recent developments include forming three-dimensional (3D) semiconductor devices using thin film transistor (TFT) techniques applied to charge trapping memory techniques, and cross-point array techniques applied for anti-fuse memory. In respect to the latter, multiple layers of word lines and bit lines are provided with memory elements at their respective cross-points. Developments also include forming vertical NAND cells using charge-trapping memory technology, in which a multi-gate field effect transistor structure having a vertical channel operating like a NAND gate uses silicon-oxide-nitride-oxide-silicon (SONOS) charge trapping technology to create a storage site at each gate/vertical channel interface. In respect to the latter, recent developments have improved the size and manufacturing costs for three-dimensional semiconductor devices by forming stacks of strips of conductive material separated by insulating material and providing memory elements in interface regions between conductive materials of the stacks.

FIG. 1 shows a schematic diagram illustrating a 3D NAND Flash array structure. This figure shows a partial VG device as an example, which includes a string select line ($SSL_n$) 10, a global select line (GSL) 11, channels 12, source line (SL) 17, source lines ($SSL_n$) 18, source contacts 20, metal line 21, bit lines 31, 32, 33, and bit line contacts 41, 42, 43, arranged in 3D fashion. The string select lines ($SSL_n$) 10 and the global select lines (GSL) 11 may include additional silicide layer on top of poly plugs to reduce the overall resistance.

SUMMARY

In the fabrication of semiconductor devices, different structures may be placed in proximity to each other in the formation of a finished device. For example, a 3D memory structure may include peripheral circuitry and array circuitry. The varying conditions required for the formation of the different structures may cause adverse affects to other structures. The 3D memory array structure may comprise a large step height difference in or about the array and periphery boundary. In order to compensate this large step height difference, complex planar processes need to adopted, and several more extra steps need to be performed, which are recognized in the present disclosure to be time and cost consuming.

Therefore, there is a need to provide an improved manufacturing process flow to further reduce the number of steps.

Disclosed herein are semiconductor devices and methods for fabricating a semiconductor device. In an embodiment, a method of fabricating a semiconductor device comprises providing a substrate. The method further comprises forming, on the substrate, an array region having a first height, a peripheral region having a second height greater than the first height, and a border region, the border region separating the array region from the peripheral region. The method further comprises forming a plurality of alternating insulative and conductive layers over at least a portion of the array region and the border region. The method further comprises forming a trench through the plurality of alternating insulative and conductive layers in at least a portion of the border region, the trench having sloping sidewalls.

In another exemplary embodiment, a semiconductor device comprises a substrate and an array region formed on the substrate, the array region having a first height. The semiconductor device further comprises a peripheral region formed on the substrate, the peripheral region having a second height greater than the first height. The semiconductor device further comprises a border region separating the array region from the peripheral region. The semiconductor device further comprises a plurality of alternating insulative and conductive layers formed over at least a portion of the array region and the border region. The semiconductor device further comprises a trench formed through the plurality of alternating insulative and conductive layers in at least a portion of the border region, the trench having sloping sidewalls.

BRIEF DESCRIPTION OF THE DRAWINGS

Features, aspects, and embodiments of the inventions are described in conjunction with the attached drawings, in which:

FIG. 2 is a cross-sectional view of an exemplary semiconductor device after the silicon substrate in the array region etched away;

FIG. 3 is a cross-sectional view of an exemplary semiconductor device after alternating insulating/conductive stack formed in the entire substrate surface;

FIG. 4 is a cross-sectional view of an exemplary semiconductor device after trench etching performed in the array region;

FIG. 5 is a cross-sectional view of an exemplary semiconductor device after the planarization structure formed in the trench of the array region;

FIG. 8 is a cross-sectional view of another exemplary semiconductor device after the trench is formed in the array region;

FIG. 9 is a cross-sectional view of another exemplary semiconductor device after the planarization process completed;

FIGS. 13(a) to 13(d) illustrate cross-sectional views of an example embodiment of fabricating a semiconductor device.

Figure 1:
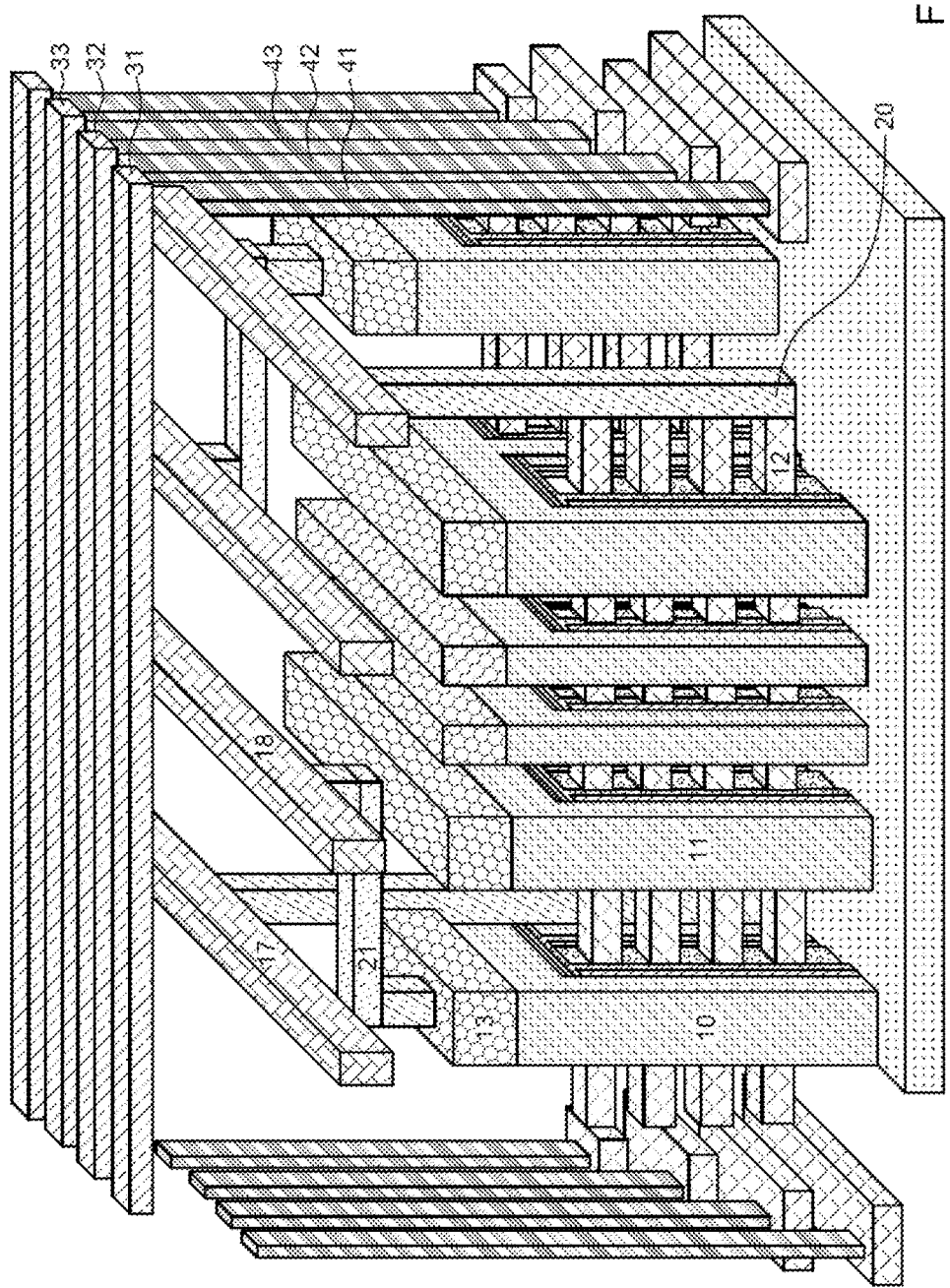
FIG. 1 shows a schematic view illustrating a 3D NAND flash array.

These exemplary figures and embodiments, along with the exemplary figures that are included in the body of this patent application, are to provide a written, detailed description of the subject matter set forth by any claims that issue from the present application. These exemplary figures and embodiments should not be used to limit any claims that ultimately issue in a patent from the present application.

Further, although similar reference numbers may be used to refer to similar structures for convenience, it can be appreciated that each of the various example embodiments may be considered to be distinct variations.

DETAILED DESCRIPTION

Example embodiments will now be described with reference to the accompanying drawings, which form a part of the present disclosure, and which illustrate example embodiments which may be practiced. As used in the present disclosure and the appended claims, the terms "example embodiment," "exemplary embodiment," and "present embodiment" do not necessarily refer to a single embodiment, although they may, and various example embodiments may be readily combined and/or interchanged without departing from the scope or spirit of example embodiments. Furthermore, the terminology as used in the present disclosure and the appended claims is for the purpose of describing example embodiments only and is not intended to be limitations. In this respect, as used in the present disclosure and the appended claims, the term "in" may include "in" and "on," and the terms "a," "an" and "the" may include singular and plural references. Furthermore, as used in the present disclosure and the appended claims, the term "by" may also mean "from," depending on the context. Furthermore, as used in the present disclosure and the appended claims, the term "if" may also mean "when" or "upon," depending on the context. Furthermore, as used in the present disclosure and the appended claims, the words "and/or" may refer to and encompass any and all possible combinations of one or more of the associated listed items.

The present disclosure relates generally to multilayer semiconductor structures, and more specifically, relates to forming high quality multilayer stacks for 3D vertical gate (VG) NAND devices.

FIG. 2 illustrates an example embodiment of a 3D VG semiconductor device on a substrate 100. The semiconductor device may include an array region 14 and a peripheral region 16. In order to fabricate a 3D memory device in the array region 14, a substantial step height h may be formed in the semiconductor substrate 100 between the array region 14 and the peripheral region 16. In an example embodiment, the step height h may be in the range of 0.8 to 1.6 μm.

Isolation structures, such as trench isolations 102 illustrated in FIG. 2, are formed in the periphery region 16 and then portions 202a of the substrate in the array region are etched away. The after etch inspection (AEI) profile angle α of the array deep trench (ADT) 202a will depend on the ADT photoresist profile and etch recipe. As illustrated in FIG. 3, alternating insulating 104 and conductive 106 layers may be formed as a stack over substrate 100. In one embodiment, the first insulating layer 104a may be thicker than other insulating layer such as in the range of 1500 to 3000 Angstroms. The material of the insulating layer 104 may be an oxide and formed by LPCVD process, while the conductive layer 106 may be an n-type polysilicon or p-type polysilicon. In example embodiments, a total of 16 alternating conductive 106 and insulating 104 layers may be formed having a total thickness of about 11000 Angstroms. It is to be understood in the present disclosure that the number of alternating polysilicon 106 and insulating 104 layers formed in the stack may be greater than or less than 16 in example embodiments. Furthermore, it is recognized in the present disclosure that the thicknesses of each layer, and other process variables, may be substantially the same as or modified from those described above and in the present disclosure.

As illustrated in FIG. 4, a patterning process may be performed in the array/periphery boundary region to form trench 108. In an example embodiment, there is a 3 μm spacing separating the edges of the trench 108, as shown in the figure. Since the trench 108 is formed as a bowl-like shape (i.e., wider around the top portions of the trench 108), the sidewalls 108a may comprise a tapered slope. In this regard, the remaining portion of the alternating insulating layers 104 and conductive layers 106 may comprise a tapered side.

Figure 10:
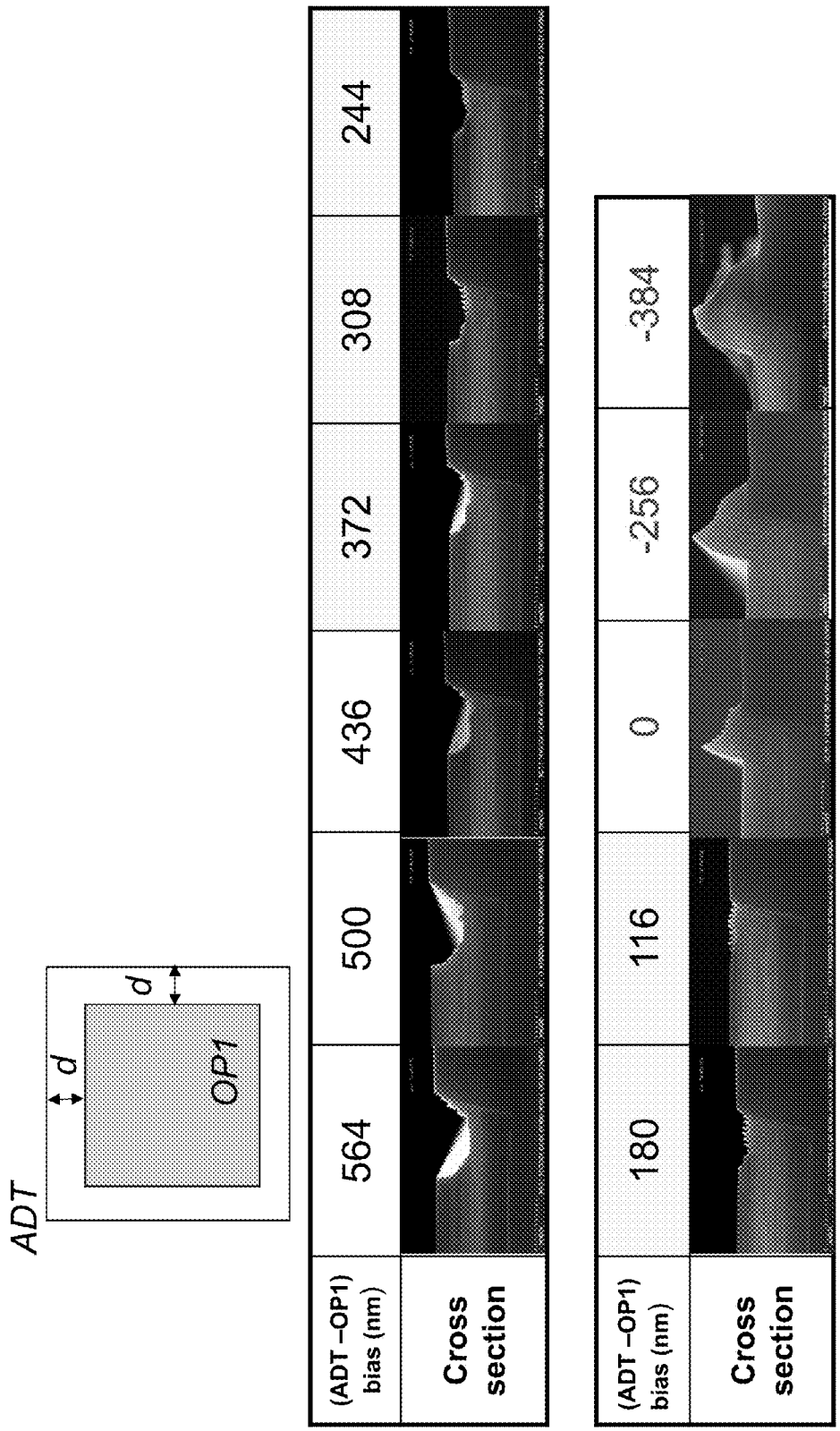
FIG. 10 illustrates example experimental data regarding factors that may impact the process of fabricating a semiconductor device; and the cross-section profile with different ADT-OP1 bias.

The patterning process may include anisotropic etching. The after etch inspection (AEI) profile angles β and α of the tapered slope sidewall 108a will depend on the OP1 photoresist profile and etch recipe. It is recognized in the present disclosure that several factors may affect the process, including overlay (OVL) shift and exposure energy. FIG. 10 provides example experimental data in respect to overlay shift and exposure energy in the range of 1800 to 220 J/M$^2$.

As illustrated in FIG. 5, first, a pad nitride layer 110 may be formed. Thereafter, a deposition and planarization process may be performed to form an HDP oxide structure 112.

Figure 6:
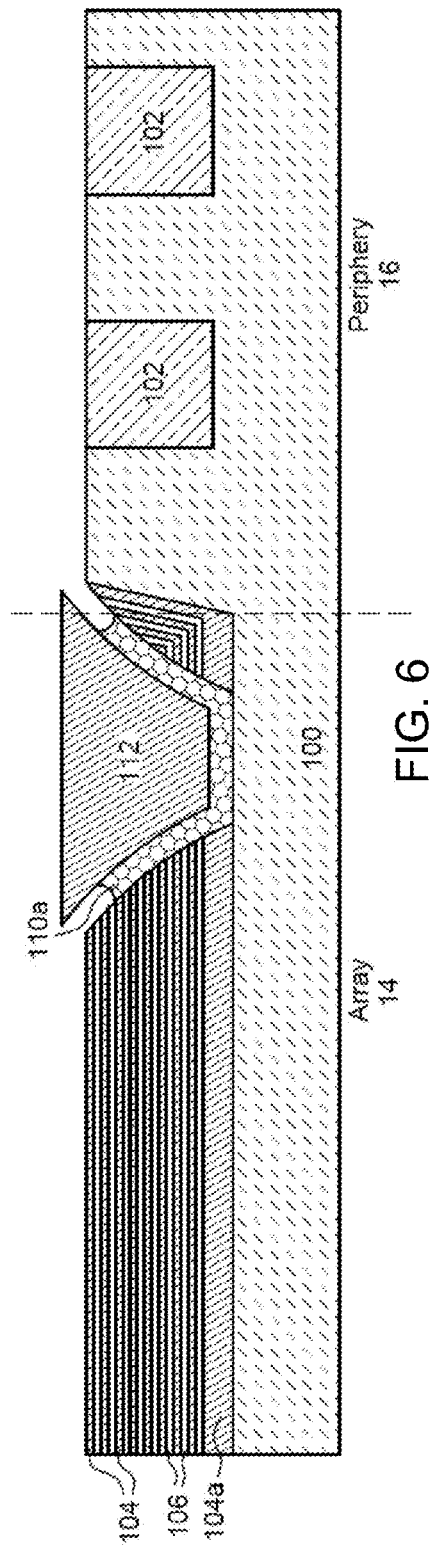
FIG. 6 is a cross-sectional view of an exemplary semiconductor device after the nitride liner layer outside the trench removed.

As illustrated in FIG. 6, portions of the pad nitride layer 110 outside the trench may be removed, leaving a portion 110a of the pad nitride 110a. The nitride layer 110 may be removed by exposing the semiconductor substrate 100 to $H_3PO_4$. The $H_3PO_4$ will remove the exposed nitride in the peripheral region 16 and the array region 14.

Figure 7:
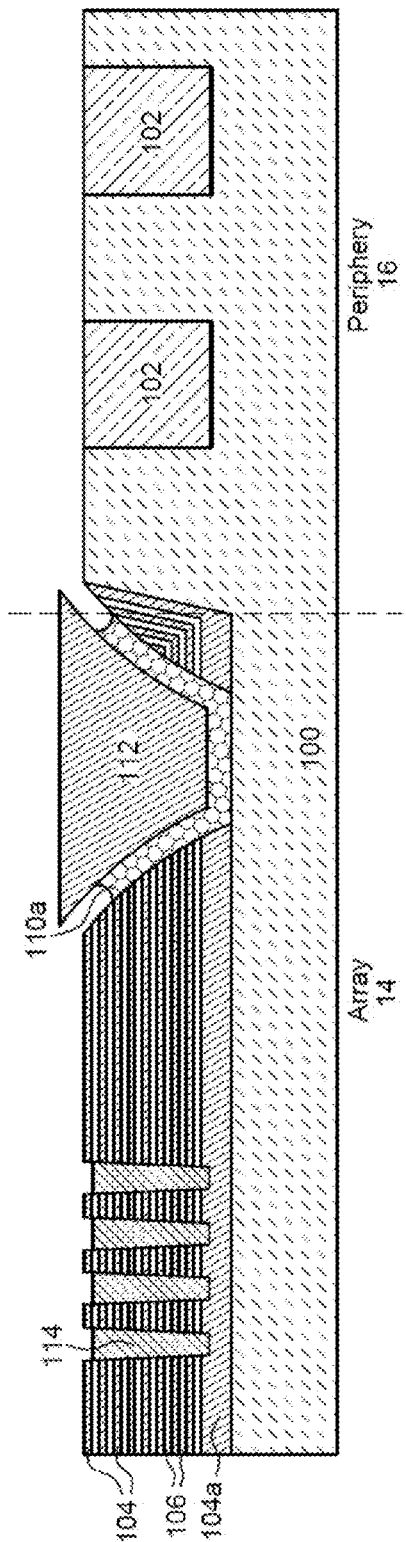
FIG. 7 is a cross-sectional view of an exemplary semiconductor device after poly plugs formed in the array region.

Poly plugs 114 may be formed in the array region 14, as illustrated in FIG. 7. In performing the above actions, a structure may be formed comprising STI 102, tapered shape insulating layer/poly stack 104/106, bowl shape SiN/HDP oxide 110a/112 isolation, and poly plugs 114 as shown in FIG. 7.

It is to be understood in the present disclosure that the spacing separating the edges of the trench 108 may be smaller than 3 μm in example embodiments. For example, if the spacing is between about 0.8-1.5 μm, as shown in FIG. 8, the trench 118 may not be opened all the way through to the bottom, as shown in the figure, after the trench etching. In this regard, the pad nitride layer 110 may be formed, followed by the HDP oxide 112 deposition and performing the planarization step to obtain a planar surface as shown in FIG. 9.

Thereafter, additional processes may be performed so as to form a three-dimensional vertical gate (VG) NAND device, such as the one shown in FIG. 1. It is to be understood herein that the aforementioned fabrication steps to form a three-dimensional vertical gate (VG) NAND device is just one example device which can be fabricated by the present invention, and semiconductor devices other than three dimensional vertical gate (VG) NAND devices are also contemplated in example embodiments.

The 3D memory array structure manufactured in the process described above may comprise a large step height difference between the array and periphery boundary. In order to compensate this large step height difference, complex planar processes may be required, including several extra steps, which are time and cost consuming.

Figure 11A:
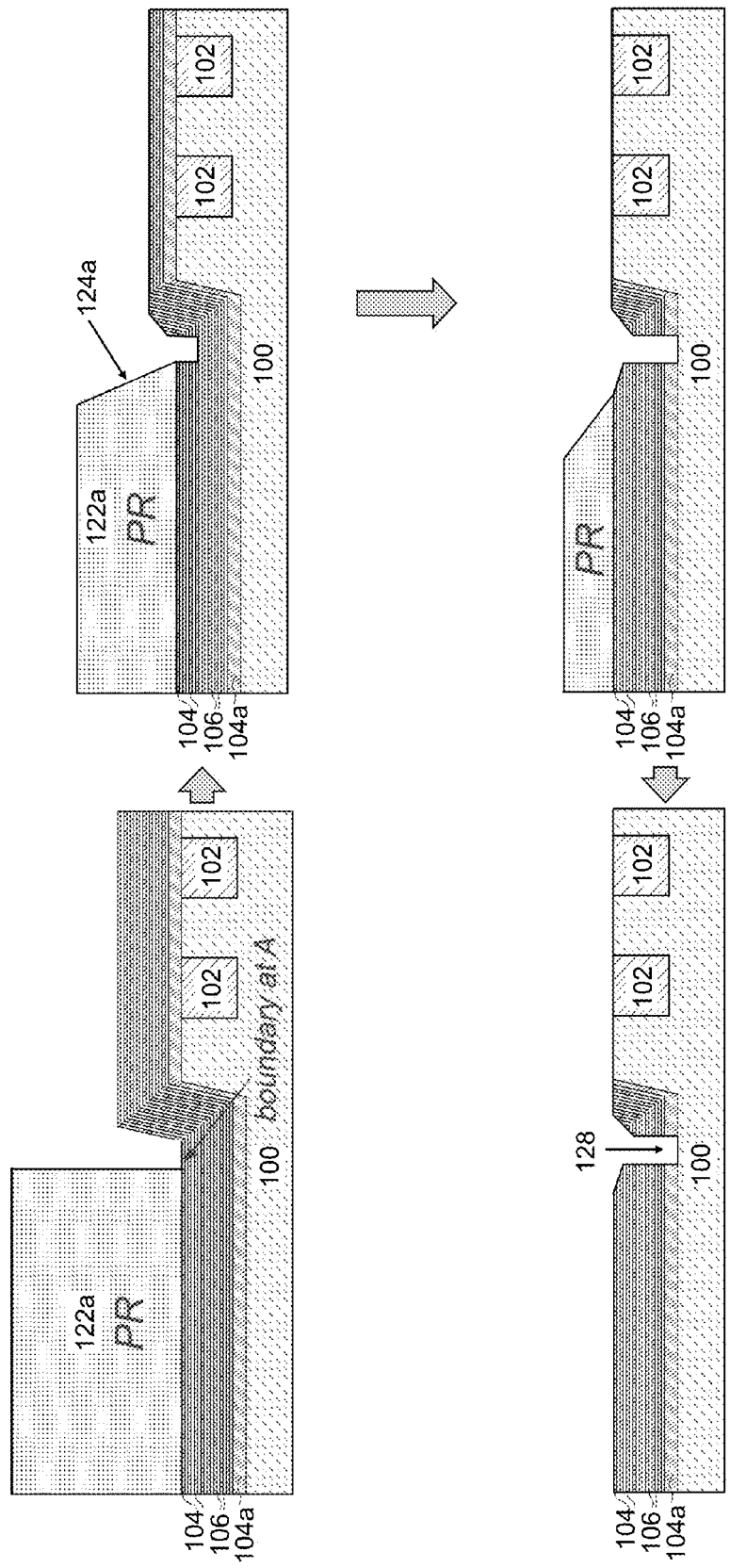
FIGS. 11(a) to 11(d) illustrate cross-sectional views of an example embodiment of fabricating a semiconductor device.

An example embodiment of an improved manufacturing process may enable a reduction in the number of steps. Whereas the previous embodiment is directed to a formation of a large gap between the array/peripheral boundary and the isolation structure in the array region as shown in figure, the OP1 photo mask can be pattern right on the array/peripheral boundary. Please refer to FIGS. 11A-D illustrating different locations A, B, C, and D of photoresist boundaries. As shown in the first illustration of FIG. 11A, a gap may be formed between the array/peripheral boundary of the photoresist 122a and the layers 104, 106, 104a. The second illustration of FIG. 11A illustrates a result after performing an etching step to remove excess insulating/poly layers to create a planar surface on the substrate 100. In doing so, photoresist boundary 124a may have a tapered slope due to the lateral etching of the etching step. The etching step may also remove portions of the array region after the excess insulating and poly layers in the peripheral region has been removed (as illustrated in the third and fourth illustration of FIG. 11A), which may require further insulation filling and planarization to be performed as in the previous embodiments.

Figure 11B:
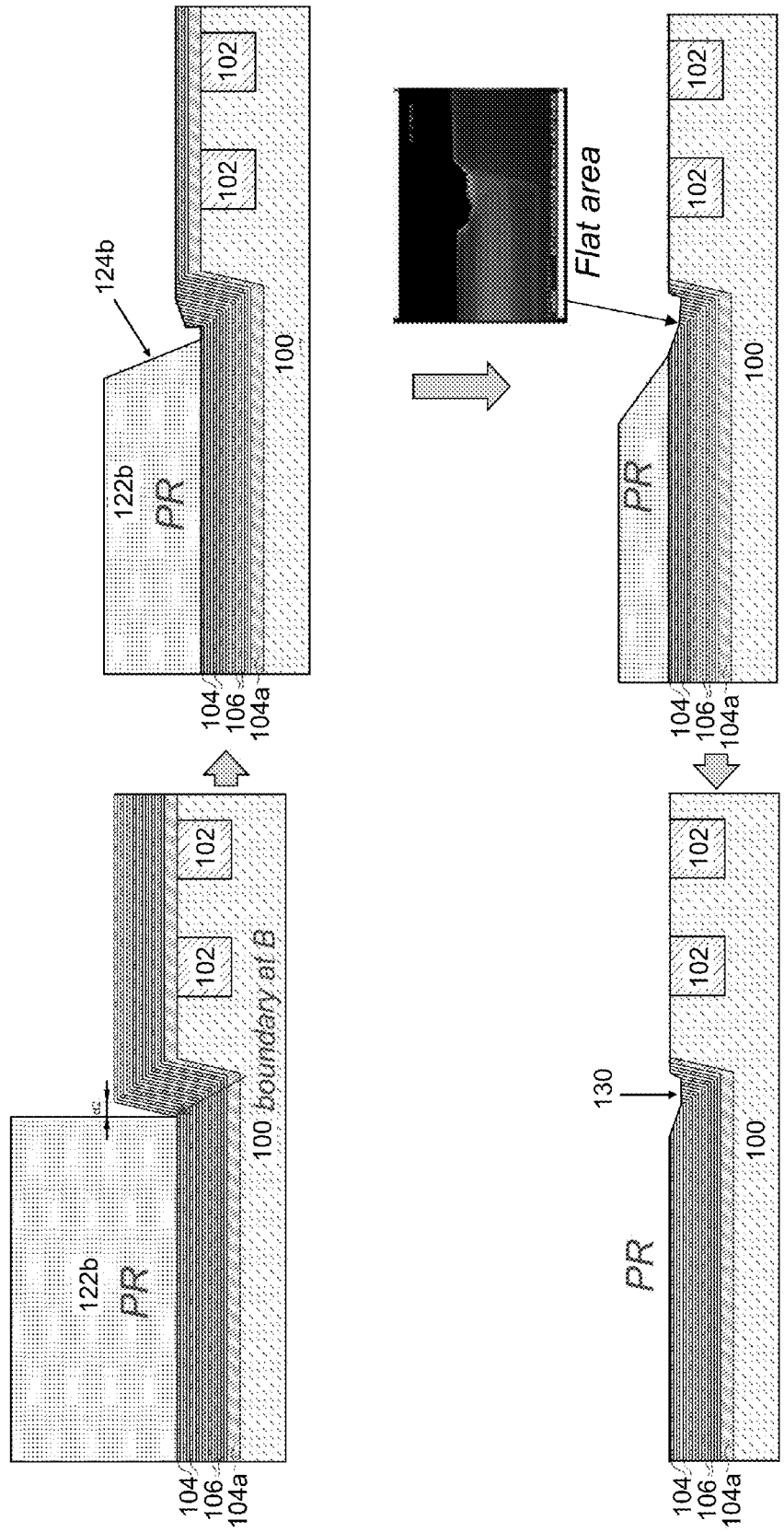

Referring now to the first illustration of FIG. 11B, a photoresist layer 122b may be formed without a gap between the array/peripheral boundary of the photoresist 122b and the layers 104, 106, and 104a. After performing an etching step to remove excess insulating/poly layers (second and third illustrations of FIG. 11B), the photoresist boundary 124b may have a tapered slope and a planar (flat) surface, as illustrated in the third illustration of FIG. 11B. As the photoresist boundary 124b again has a tapered slope due to lateral etching, a portion of the top surface of the photoresist is again etched away. Upon removal of the photoresist, as illustrated in the fourth illustration of FIG. 11B, only a small recess with a flat area 130 remains. Accordingly, further insulation filling and planarization may not be required as in the previous embodiment of FIG. 11A.

Figure 11C:
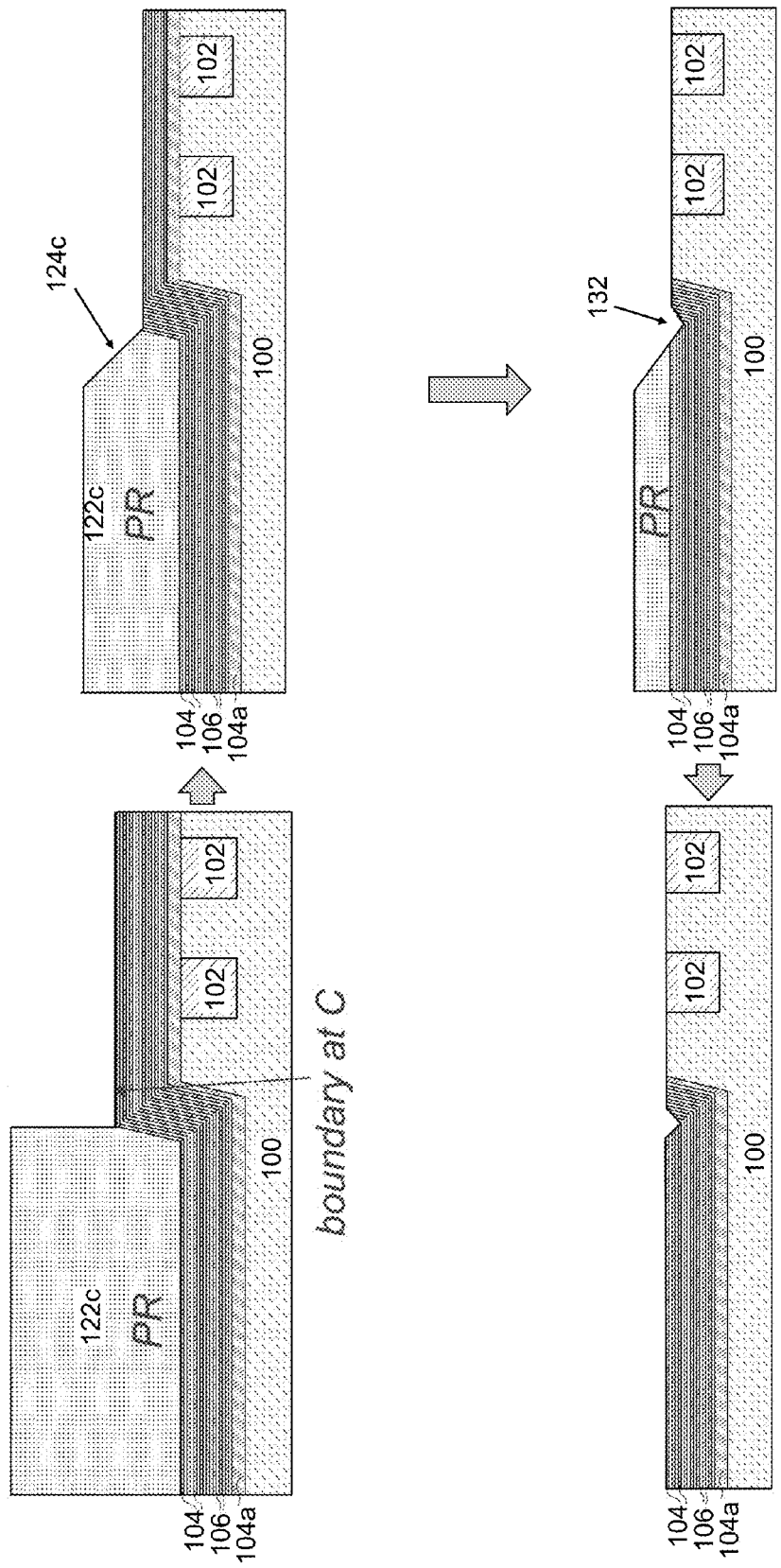

FIG. 11C illustrates another example embodiment in which the photoresist may be formed at a boundary C. After performing an etching step to remove excess insulating/poly layers (second and third illustrations of FIG. 11C), the photoresist boundary 124c may have a tapered slope. Upon removal of the photoresist, as illustrated in the fourth illustration of FIG. 11C, only a small recess 132 without a flat area may be formed. Accordingly, further insulating filling and planarization may not be required as in the previous embodiment of FIG. 11A.

Figure 11D:
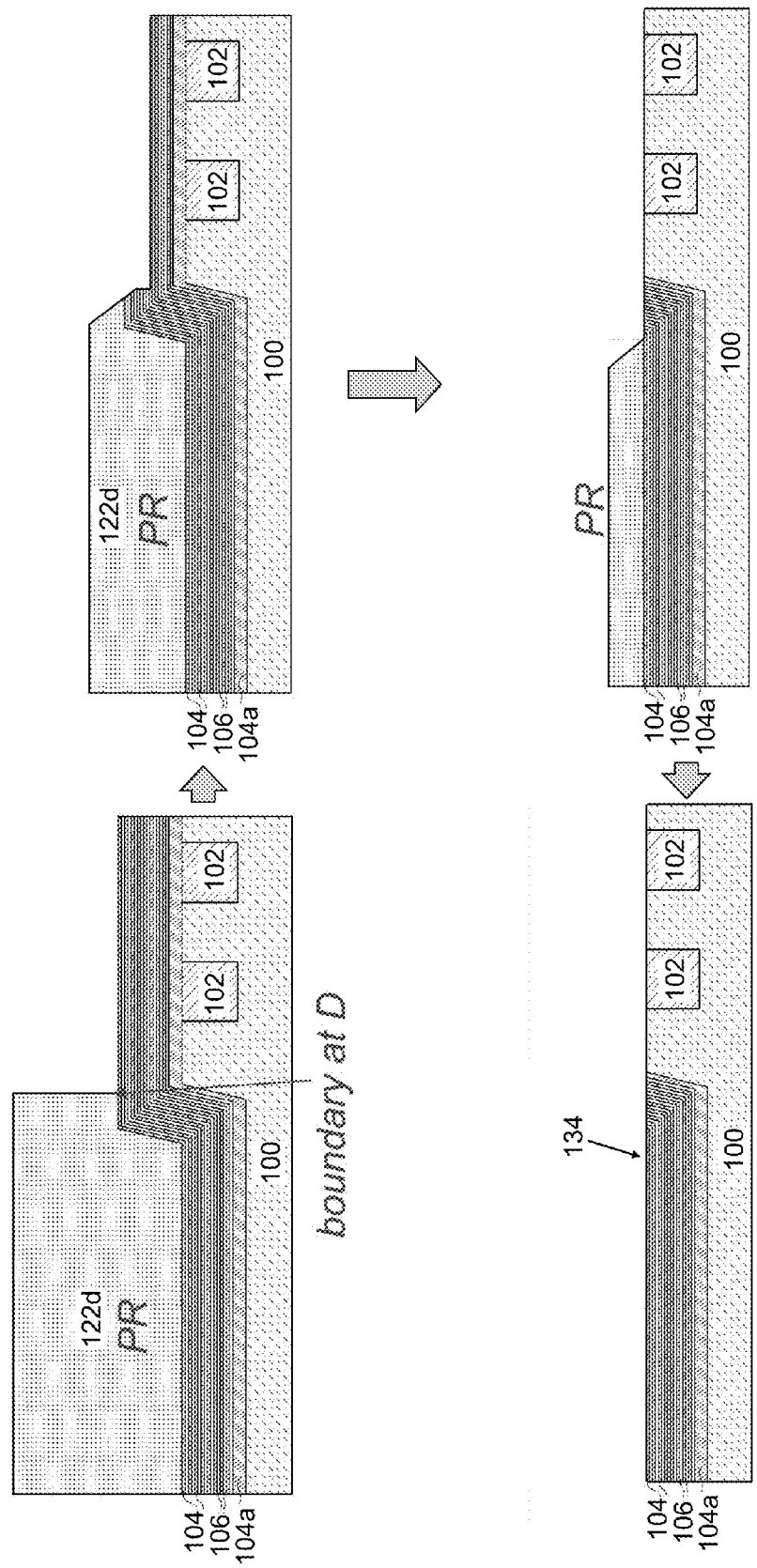

FIG. 11D illustrates another example embodiment in which the photoresist may be formed at a boundary D. After performing an etching step to remove excess insulating/poly layers (second and third illustrations of FIG. 11D), the photoresist boundary 124c may have a tapered slope. Upon removal of the photoresist, as illustrated in the fourth illustration of FIG. 11D, only a small planar surface 134 may be formed. Accordingly, further insulating filling and planarization may not be required as in the previous embodiment of FIG. 11A.

Figure 12:
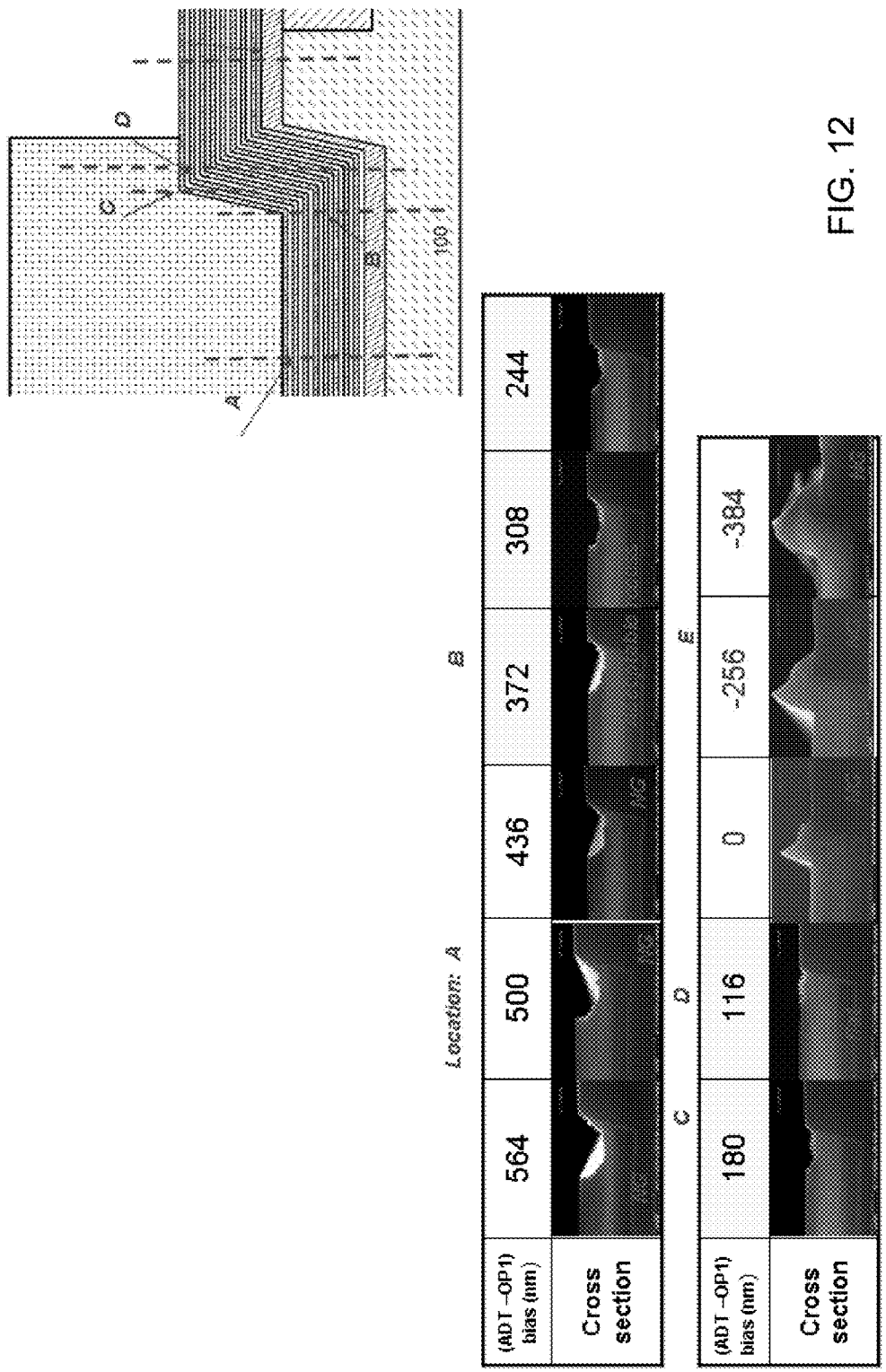
FIG. 12 illustrates example embodiments of forming a photoresist layer during the fabrication of a semiconductor device.

In example embodiments, a photoresist may be formed between the boundaries indicated by B and D, as illustrated in FIG. 12. In this regard, a distance between boundaries B and D may be about 260 nm, a distance between boundaries B and C may be about 200 nm, and a distance between boundaries C and D may be about 60 nm in example embodiments.

Figure 13B:
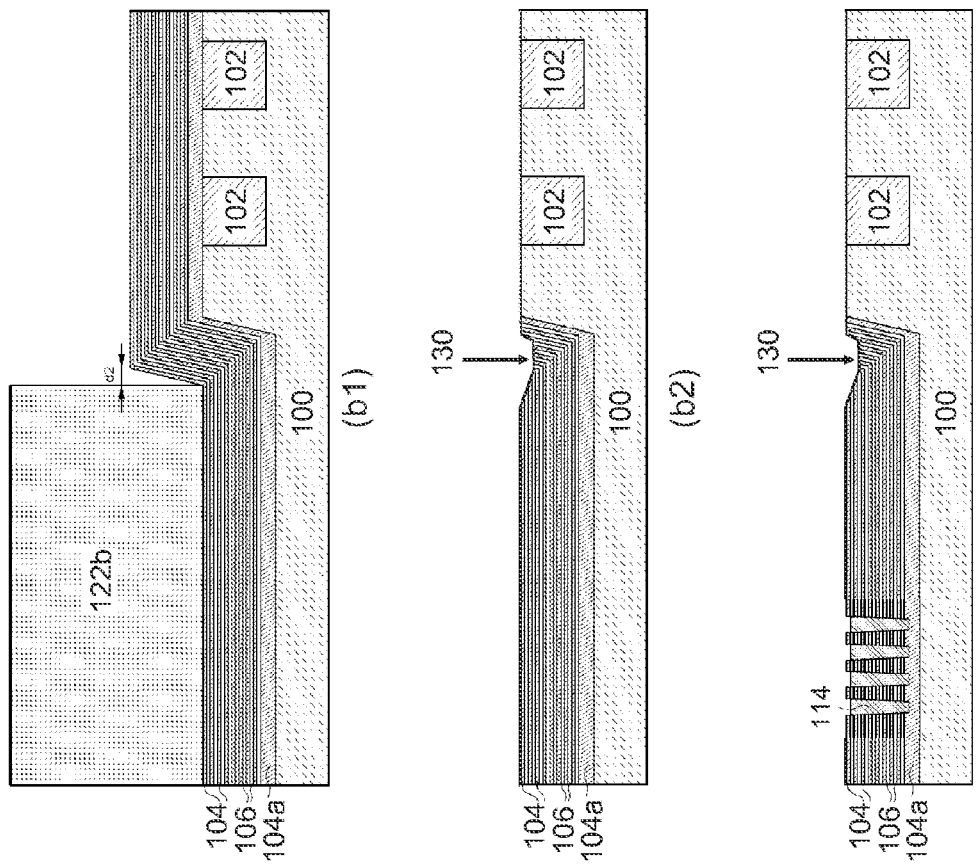

Referring now to FIG. 13a, a large gap d1 may be formed between the array/peripheral boundary and the layers 104, 106, and 104a, wherein the photoresist pattern 120 only covers the array region 14. A deep trench 108 with a tapered sidewall 108a may be formed after patterning the array region 14. Isolation structures 102 may be formed in the silicon substrate 100 of the periphery region. Thereafter, insulating layer/conductive 104/106 stack may be formed over the substrate 100 surface. Then, a patterning process may be performed in the array/periphery boundary region to remove excess insulating layer/poly 104/106 stack in the peripheral region 16 in order to obtain a planar substrate surface between the two regions. Thereafter, a patterning process may be performed to remove excess insulating/conductive layers so as to create a planar surface on the substrate 100. FIGS. 13b, 13c, and 13d, on the other hand, illustrate the formation of a small recess 130, 132, and 134. It is recognized in the present disclosure that such small recesses 130, 132, and 134, which may be formed via boundaries B, C, and D illustrated in FIGS. 11B-D, respectively, are smaller than the trench 108. Accordingly, further insulating filling and planarization may not be required as in the previous embodiment of FIG. 13a.

Thereafter, poly plugs 114 may be formed in the array region 14, and other planarization steps may be performed as needed to arrive at a planar surface.

It is to be understood in the present disclosure that other actions may be performed in addition to or in replacement of the actions described above and in the present disclosure, including forming sidewalls of the trench 108 and/or recess 130, 132, and 134 to have a more vertical profile (i.e., larger angle α).

The array may be implemented in an integrated circuit. The integrated circuit may also include a controller, which may be connected to word lines, string select lines, bit lines, and other lines associated with the array. Through these connections and by utilizing sense circuitry, the controller may coordinate array operations including read, write, and programming operations. The controller may be implemented as a general purpose processor, which executes a computer program to control the array operations. The computer program may be stored in non-transitory memory accessible by the processor. In other embodiments, the controller may be implemented through special purpose application circuitry, or a combination of modules providing system-on-a-chip functionality supported by the memory array, as is known in the art. In yet other embodiments, the controller may be implemented through a combination of special-purpose logic circuitry and a general-purpose processor. Further, the controller may implement or utilize a finite state machine to perform the array operations.

It is to be understood that the principles described herein can be applied outside the context of NAND flash memory devices described in the exemplary embodiments, including NOR flash memory devices, one-time programmable (OTP) memory devices, other anti-fuse-based memory devices, floating gate memory devices, charge trapping memory devices, nonvolatile memory devices, embedded memory devices, and/or other memory devices, or even MOS devices.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

For example, as referred to in the present disclosure, "forming" a layer, plurality of layers, plurality of alternating layers, multilayer, stack, and/or structure may include any method of creating the layer, multilayer, and/or structure, including depositing and the like. A "multilayer" may be one layer, structure, and/or stack comprising a plurality of internal layers and/or a plurality of layers, multilayers, structures, and/or stacks stacked or formed on or over one another. Internal structures may include any internal structure of a semiconductor device, including charge storage structures such as silicon-oxide-nitride-oxide-silicon (SONOS) or bandgap engineered silicon-oxide-nitride-oxide-silicon (BE-SONOS) structures comprising a tunneling dielectric layer, a trapping layer, and a blocking oxide layer.

Although one or more layers, multilayers, and/or structures may be described in the present disclosure as being "silicon," "polysilicon," "conductive," "oxide," and/or "insulative" layers, multilayers, and/or structures, it is to be understood that example embodiments may be applied for other materials and/or compositions of the layers, multilayers, and/or structures. Furthermore, such structures may be in the form of a crystalline structure and/or amorphous structure in example embodiments.

Furthermore, "patterning" of one or more layers, multilayers, and/or structures may include any method of creating a desired pattern on the one or more layers, multilayers, and/or structures, including performing a photolithography process by applying a photoresist mask (not shown) having pre-formed patterns and etching the layers, multilayers, and/or structures according to the pre-formed patterns on the photoresist mask.

It is to be understood in the present disclosure that the principles described can be applied outside the context of NAND-type devices described in exemplary embodiments, including NOR-type devices, other memory storage devices, floating gate memory devices, charge trapping memory devices, non-volatile memory devices, and/or embedded memory devices.

Various terms used in the present disclosure have special meanings within the present technical field. Whether a particular term should be construed as such a "term of art" depends on the context in which that term is used. "Connected to," "in communication with," "associated with," or other similar terms should generally be construed broadly to include situations both where communications and connections are direct between referenced elements or through one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of fabricating a semiconductor device, the method comprising:
    providing a substrate, the substrate having:
        an array region of the substrate, the array region of the substrate having a first height, the first height being a height between a top surface and bottom surface of the substrate in the array region;
        a peripheral region of the substrate, the peripheral region of the substrate having a second height greater than the first height, the second height being a height between a top surface and bottom surface of the substrate in the peripheral region; and
        a border region of the substrate, the border region of the substrate separating the array region of the substrate from the peripheral region of the substrate, the border region of the substrate adjoining the array region of the substrate and the peripheral region of the substrate;
    forming a plurality of alternating insulative and polysilicon layers over at least a portion of the top surface of the array region of the substrate and a top surface of the border region of the substrate;
    forming a trench in the border region, the trench formed by removing at least a portion of the plurality of alternating insulative and polysilicon layers formed in the border region, the removing performed in such a way that a top surface of the trench resulting after the removing is lower in height than the second height, the trench formed substantially parallel to the border region of the substrate in such a way as to separate the array region of the substrate from the peripheral region of the substrate, the trench having sloping sidewalls; and forming a plurality of memory cells over the array region of the substrate.

2. The method of claim 1, wherein the border region comprises a steep step connecting a surface of the array region with a surface of the peripheral region, and the plurality of alternating insulative and polysilicon layers is formed over at least a portion of the sidewall of the steep step.

3. The method of claim 2, wherein the trench through the plurality of alternating insulative and polysilicon layers is formed by placing a photoresist over the array region and at least a portion of the border region.

4. The method of claim 3, wherein a gap formed between an edge of the photoresist and an outer surface of the plurality of alternating insulative and polysilicon layers formed over the sidewall of the steep step is less than about 3 microns.

5. The method of claim 3, wherein a gap formed between an edge of the photoresist and an outer surface of the plurality of alternating insulative and polysilicon layers formed over the sidewall of the steep step is about 120 nm to 380 nm.

6. The method of claim 1, further comprising forming a dielectric layer over at least a portion of the trench, wherein the forming the dielectric layer over at least a portion of the trench includes forming the dielectric layer over at least a portion of the sloping sidewalls of the trench.

7. The method of claim 6, wherein the dielectric layer comprises nitride oxide layer.

8. The method of claim 5, further comprising filling the trench with a second dielectric material.

9. A semiconductor device comprising:
a substrate, the substrate having:
an array region of the substrate, the array region of the substrate having a first height, the first height being a height between a top surface and bottom surface of the substrate in the array region;
a peripheral region of the substrate, the peripheral region of the substrate having a second height greater than the first height, the second height being a height between a top surface and bottom surface of the substrate in the peripheral region; and
a border region of the substrate, the border region of the substrate separating the array region of the substrate from the peripheral region of the substrate, the border region of the substrate adjoining the array region of the substrate and the peripheral region of the substrate;
a plurality of alternating insulative and polysilicon layers formed over at least a portion of the top surface of the array region of the substrate and a top surface of the border region of the substrate;
a trench formed in the border region, the trench formed by removing at least a portion of the plurality of alternating insulative and polysilicon layers formed in the border region, the removing performed in such a way that a top surface of the trench resulting after the removing is lower in height than the second height, the trench formed substantially parallel to the border region of the substrate in such a way as to separate the array region of the substrate from the peripheral region of the substrate, the trench having sloping sidewalls; and
a plurality of memory cells formed over the array region of the substrate.

10. The semiconductor device of claim 9, wherein the border region comprises a steep step connecting a surface of the array region with a surface of the peripheral region, and the plurality of alternating insulative and polysilicon layers is formed over at least a portion of the sidewall of the steep step.

11. The semiconductor device of claim 9, wherein a distance between peripheral edges of the trench is less than about 3 microns.

12. The semiconductor device of claim 9, wherein a distance between peripheral edges of the trench is about 120 nm to 380 nm.

13. The semiconductor device of claim 9, further comprising forming a dielectric layer over at least a portion of the trench, wherein the dielectric layer is formed over at least a portion of the sloping sidewalls of the trench.

14. The semiconductor device of claim 13, wherein the dielectric layer comprises nitride oxide layer.

15. The semiconductor device of claim 13, further comprising a second dielectric material in the trench.

* * * * *